United States Patent [19]
Farmer et al.

[11] Patent Number: 6,067,728
[45] Date of Patent: May 30, 2000

[54] SUPERCRITICAL PHASE WAFER DRYING/CLEANING SYSTEM

[75] Inventors: Robert B. Farmer, Billerica, Mass.;
Bernard D. Jones, Amherst, N.H.;
Kedar P. Gupta, Merrimack, N.H.;
Ijaz H. Jafri, Nashua, N.H.; Derek M. Dispensa, Methuen, Mass.

[73] Assignee: G.T. Equipment Technologies, Inc.

[21] Appl. No.: 09/023,290

[22] Filed: Feb. 13, 1998

Related U.S. Application Data

[60] Provisional application No. 60/040,979, Mar. 17, 1997.

[51] Int. Cl.$^7$ ...................................................... F26B 3/00
[52] U.S. Cl. ................................ 34/470; 34/471; 34/476; 34/78; 134/902
[58] Field of Search ............................ 34/467, 468, 469, 34/470, 471, 476, 73, 76, 78; 134/105, 107, 108, 902

[56] References Cited

PUBLICATIONS

Gregory T. Mulhern et al, *Supercritical Carbon Dioxide Drying of Microstructures*, pp. 296–300., Seventh International Conference on Solid–State Sensors & Actuators; Yokohama, Japan, 1993.

John Y. Kim et al, *Comparative Study of Various Release Methods For Polysilicon Surface Micromachining*, Jan. 1997, Nagoya, Japan, pp. 442–447.

Dai Kobayashi et al, *Photoresist–Assisted Release of Movable Microstructures*, vol. 32, 1993, pp. L1642–L1644, Jpn. J. Appl. Phys.

*Primary Examiner*—Pamela A. Wilson
*Attorney, Agent, or Firm*—Vernon C. Maine; Scott J. Asmus

[57] ABSTRACT

An apparatus and method for drying a microelectronic structure on wafer substrate using supercritical phase gas techniques and a unique pressure vessel locking mechanism. There is lid and a base with an open cavity to contain at least one microelectronic structure on wafer substrate. Clamping the lid to the base uses locking clamp rings with open jaws large to partially enclose the edge of the vessel. The clamp rings are supported symmetrically about the sides of the vessel. The rings are adjusted between an open position where the rings are clear of the vessel and a locking position where the jaws partially enclose the vessel. The jaws and the vessel share a tapered cam plate and roller system configured to bring the rings into vertically compressive locking engagement on the pressure vessel when the rings are moved into locking position. Mechanical interlocks provide security against back pressure opening the rings. The invention includes the necessary mechanisms and systems for manual or automatic closing and clamping the vessel, controlling pressure in the cavity, controlling temperature in the cavity, flowing process fluid through the cavity, venting the cavity, unclamping the pressure vessel, and removing the lid.

20 Claims, 17 Drawing Sheets

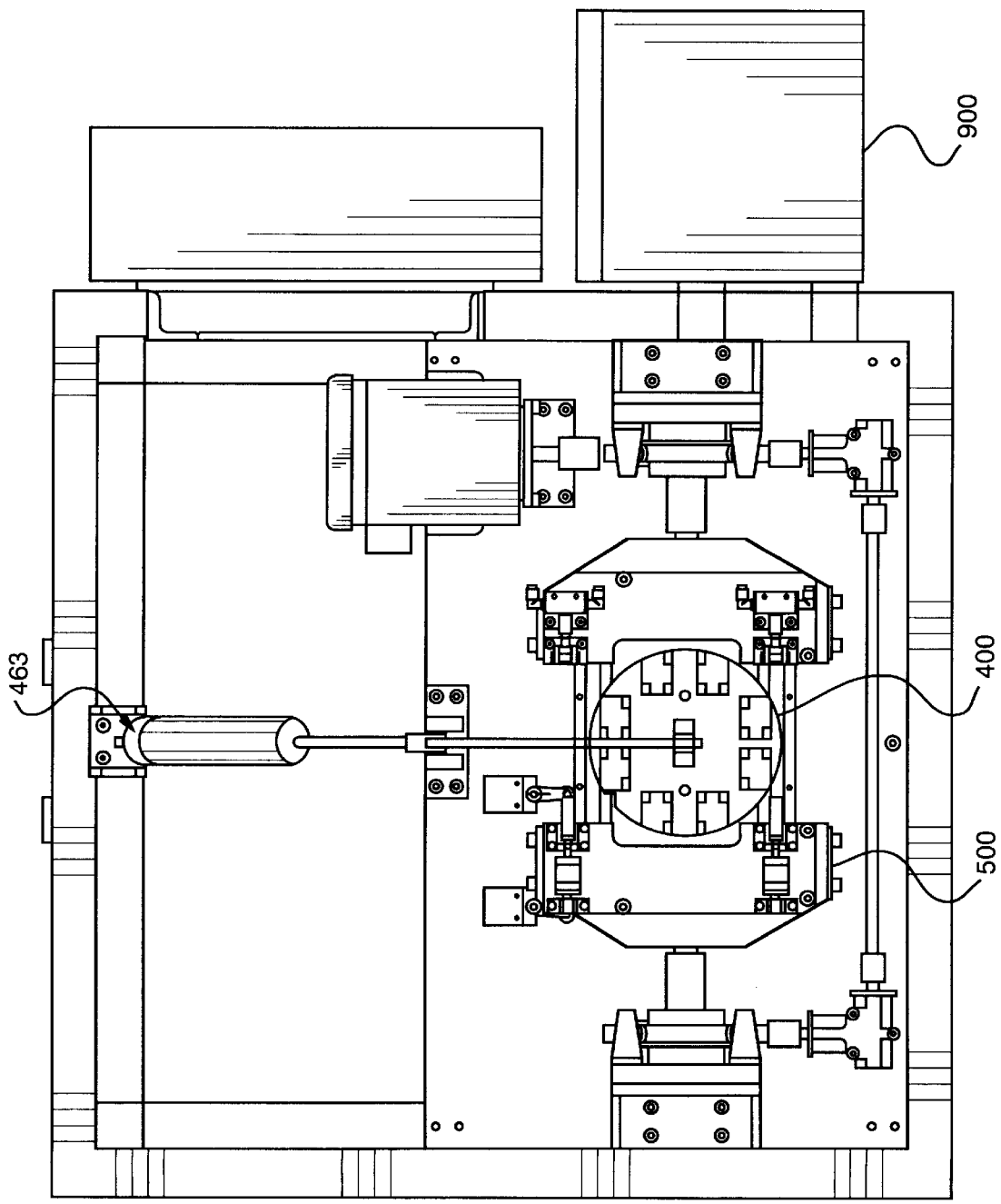

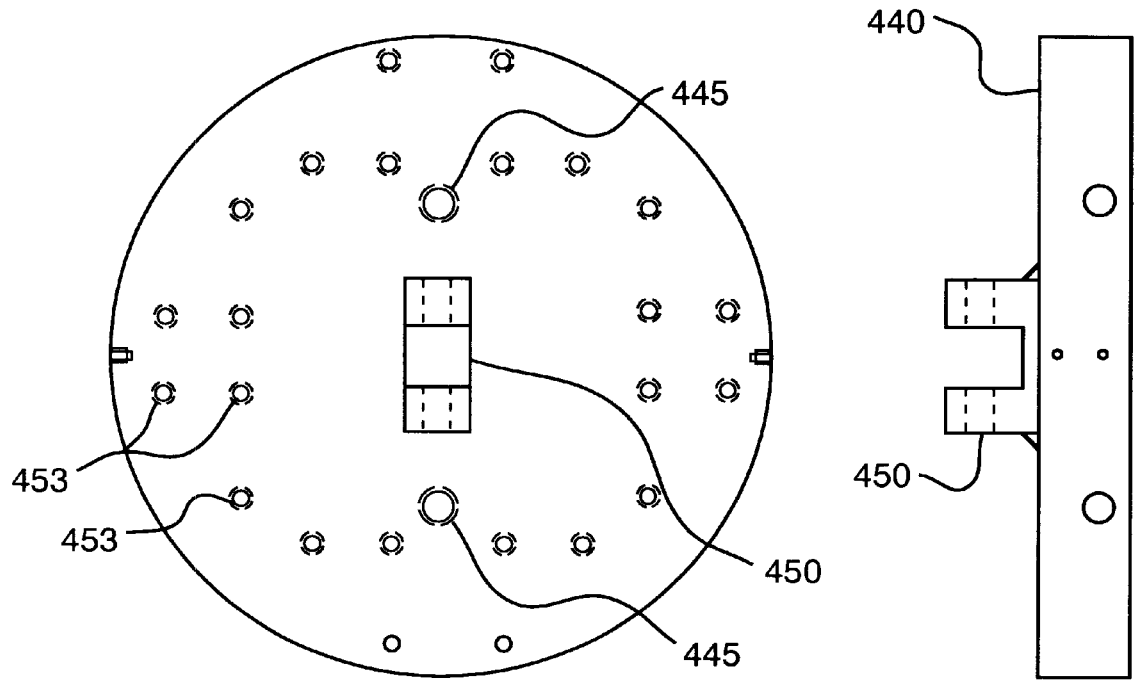
FIG. 13
FIG. 15
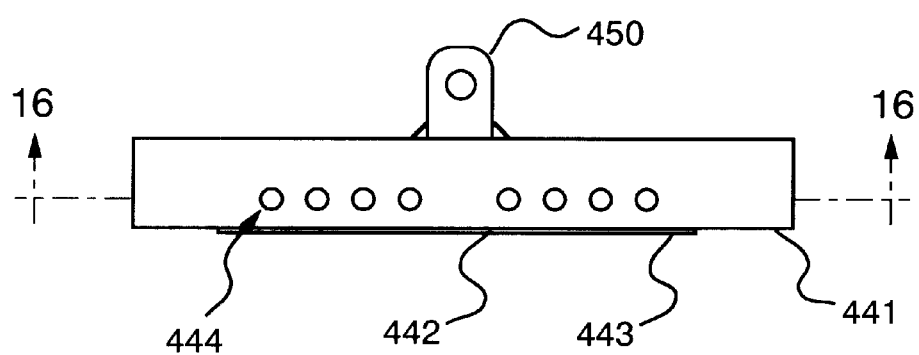
FIG. 14

SUPERCRITICAL PHASE WAFER DRYING/CLEANING SYSTEM

This application claims the benefit of U.S. Provisional Application No. 60/040,979 filed Mar. 17, 1997.

BACKGROUND OF THE INVENTION

1. Technical Field of the Invention

This invention relates to means for the drying of microelectronic wafer structures so as to avoid surface tension effects, and more particularly to methods and apparatus for drying silicon wafer microstructures with supercritical fluids.

2. Background Art

Working to find improvements to the controlled release of microstructures without subsequent sticking of these structures to the substrate, researchers at the University of California at Berkeley have developed a process for drying silicon wafers in a supercritical fluid environment. In this state, there is no liquid/vapor interface to contribute to the surface tension effects that cause long, thin microstructures in the order of 50 micrometers and up, to collapse and stick to the substrate during the drying process. The supercritical fluid of choice was $CO_2$, carbon dioxide, due to it's temperature and pressure thresholds of 31.1 degrees centigrade and 1073 pounds per square inch over atmosphere.

Using the laboratory method, a silicon wafer containing a pattern of microelectronic structure, having been fabricated in the conventional manner, is arranged with a horizontal orientation in a cavity, submerged in methanol. The cavity is sealed, and a through-flow of liquid carbon dioxide ($CO_2$) is introduced for about 15 minutes. The methanol is rapidly absorbed into the liquid carbon dioxide and carried out of the cavity. When the cavity has been entirely purged of methanol and is completely filled with pure liquid carbon dioxide, heat is applied uniformly for several minutes, causing the carbon dioxide to transition to it's supercritical phase. It is at this point that the benefit of the process is realized, as no liquid/vapor interface occurs during this transition. The $CO_2$ is then slowly vented to atmosphere, to avoid turbulence within the cavity.

A vessel that is openable at or near the plane of maximum cross section area of interior volume, and when closed is subjected to greatly elevated temperature and pressure, must be of substantial construction, with a locking mechanism adequate to safely sustain the total pressure applied. In the university laboratory set up, a circumferential pattern of 8 bolts is used to secure the lid or top to the base of the vessel, to contain the high pressure. The subject wafer is placed within the base cavity, the lid placed in position, the fasteners applied manually to secure the lid, heat applied to the vessel by external heaters, and ports in the vessel used to admit and remove the fluids of the process.

There are several obvious problems with the laboratory set up that must be addressed in order to make this process sufficiently cost-effective and efficient for use in a production environment. The device is not suitable for integration into a production line with automated means for inserting and removing wafers; the closing mechanism is manual and too slow; and the serially administered steps of the process are manually accomplished and too slow. The device is also lacking the safeguards required by industrial standards and regulations for production requirements.

SUMMARY OF THE INVENTION

The invention, in it's simplest form, is an apparatus and method for the drying of microelectronic structures on wafer substrates using supercritical phase drying techniques.

It is an object of the invention to provide an apparatus for drying a microelectronic structure on wafer substrate, consisting of a pressure vessel with a lid and a base with an open cavity, where the cavity is of uniform diameter and constant depth sufficient to contain at least one microelectronic structure on wafer substrate, and the vessel when closed has the lid emplaced on the base.

The apparatus would include a way for placing the lid on the base, and a way for clamping the lid to the base using at least two locking clamp rings linked by a drive mechanism. Each ring would have an open jaw sufficiently large to partially enclose an edge of the vessel when closed. The rings would be supported symmetrically about the circumference of the vessel and oriented with the jaws facing the vessel. The rings would be collectively movable by a force on the drive mechanism between an open position where the rings are clear of the vessel and a locking position where the jaws partially enclose the vessel. The jaws and the vessel would have a tapered cam plate and roller system configured to bring the rings into vertically compressive locking engagement on the pressure vessel when the rings are moved into the locking position.

The apparatus would also have a way for controlling pressure in the cavity, a way for controlling temperature in the cavity, a way for flowing process fluid through the cavity, a way for venting the cavity, a way to unclamp the pressure vessel, and a way to remove the lid from the base.

It is a further object to provide for clamping the lid to the base with two locking clamp rings, their jaws configured with internal upper and lower rollers, and the vessel configured with top and bottom tapered cam plates. The rollers would be configured to contact respective cam plates and bring the rings into vertically compressive locking engagement on the pressure vessel when the rings are moved into locking position.

It is a still further object of the invention to provide for automatic operation according to a predetermined sequence of process steps and within manually selectable limits of temperature, pressure and time.

It is a yet still further object to provide for automatic operation within predetermined limits of temperature, pressure and time.

It is another object to provide for rigidly interconnecting the locking clamp rings when in the locking position, such as with a latching system with mating components secured to respective locking clamp rings and aligned so as to be brought into connecting position when the rings are moved into the locking position.

It is still another object to provide for distributing the incoming flow of process fluid around the circumference of the cavity, as with a system of channels connecting an incoming port to several orifices arranged symmetrically about the circumference of the cavity.

It is yet still another object to provide for the wafer substrate being fabricated of a silicon material, the process fluid being carbon dioxide, the raising and regulating of temperature in the cavity in excess of 30 degrees centigrade, and the raising and regulating of pressure in the cavity in excess of 1000 pounds per square inch over atmosphere.

It is an additional object of the invention to provide a method for drying a microelectronic structure on wafer substrate, including the steps of submerging a microelectronic structure on wafer substrate in methanol in a horizontally oriented cavity of uniform diameter and constant vertical depth in the base of a pressure vessel that includes a base and a lid, placing the lid on the base, and clamping the lid to the base with two locking clamp rings. Each ring would have an open jaw sufficiently large to partially enclose an edge of the vessel. The rings would be located on opposite sides of the vessel and be slidingly mounted on a common rail system with the jaws facing the vessel.

The rings would be interconnected by a drive mechanism and collectively movable between an open position where the rings are clear of the vessel and a locking position where the jaws partially enclose said vessel. The jaws would be configured with internal upper and lower rollers, and the vessel with top and bottom tapered cam plates, with the cam plates oriented with respect to the rollers so as to bring the rings into vertically compressive locking engagement on the vessel when the rings are moved into locking position.

The method would further include the steps of introducing a through flow of process fluid in the cavity at supercritical temperature and pressure in a manner that minimizes turbulence in the methanol as it is being displaced, then evacuating the process fluid from the closed cavity, unclamping the lid from the base, removing the lid from the base, and removing the microelectronic structure on wafer substrate from the cavity.

It is a another additional object of the invention to provide for a method for drying a microelectronic structure on wafer substrate where the wafer substrate is fabricated of a silicon material, the process fluid is carbon dioxide, the supercritical temperature is in excess of 30 degrees centigrade, the supercritical pressure is in excess of 1000 pounds per square inch over atmosphere, and there is automatic controlling and sequencing of other steps.

Still other objects and advantages of the present invention will become readily apparent to those skilled in this art from the following detailed description, wherein I have shown and described only a preferred embodiment of the invention, simply by way of illustration of the best mode contemplated by me on carrying out my invention. As will be realized, the invention is capable of other and different embodiments, and its several details are capable of modifications in various obvious respects, all without departing from the invention.

BRIEF DESCRIPTION OF THE DRAWINGS

Dryer

FIG. 4 is a top view of the supercritical fluid dryer of FIG. 1, illustrating the layout of the principal components of the clamping mechanism in the open position surrounding the pressure vessel.

Chamber

Figure 1:
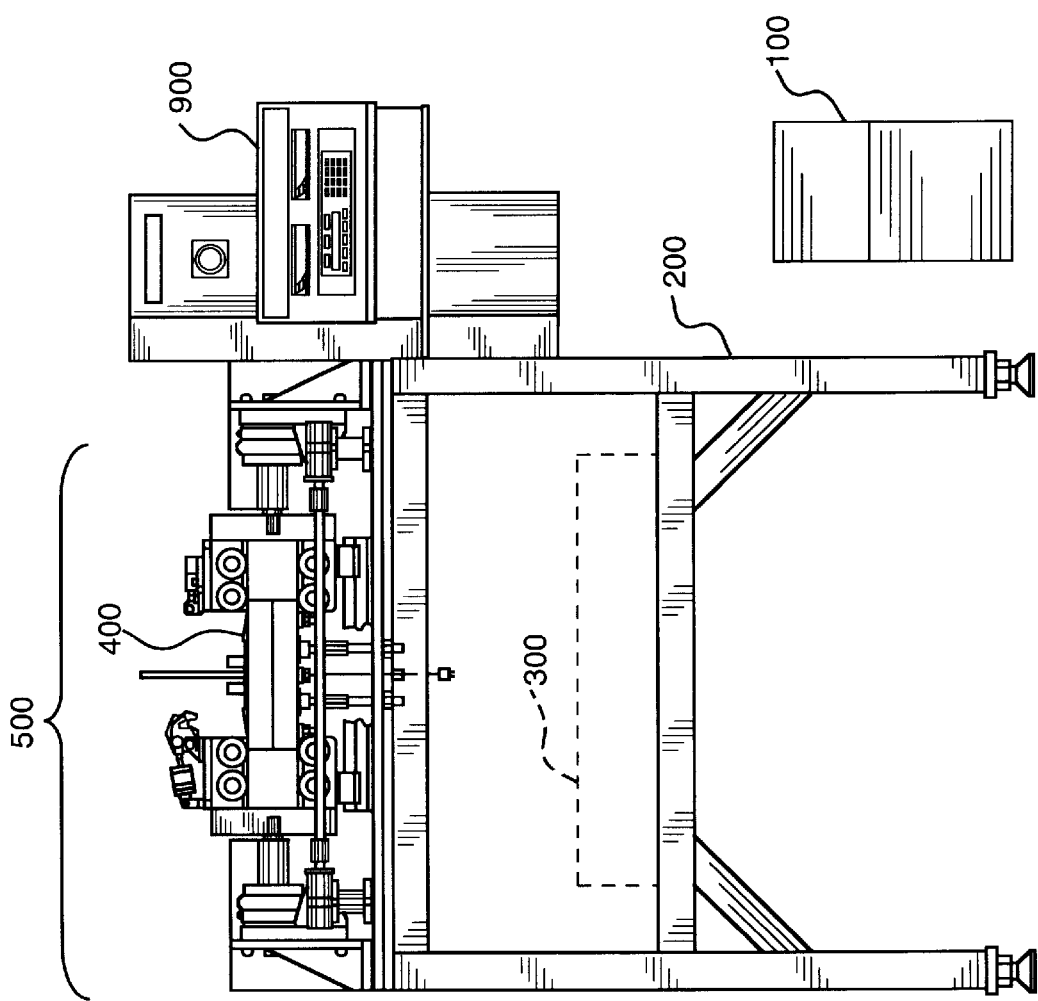
FIG. 1 is a front elevation of the supercritical fluid dryer, showing the adjacent water heater/cooler, the control panel, the valve assembly, the pressure vessel in the closed position, and the clamping mechanism in the open position.
Figure 5:
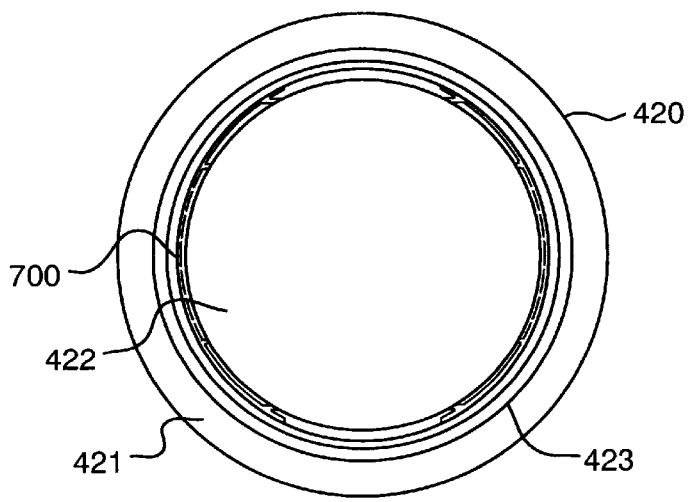

FIG. 5 is a top view of the chamber of the pressure vessel of FIG. 1, showing the lower interior of the cavity of the pressure vessel with a fluid distribution ring about the circumference.

Figure 6:
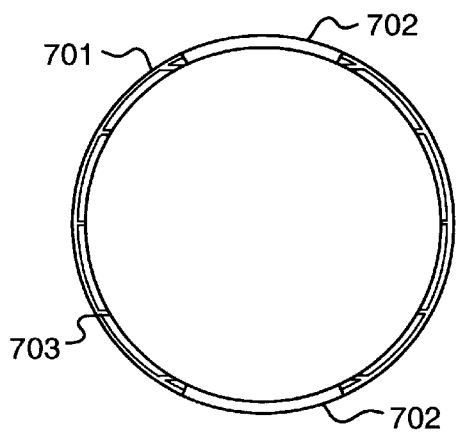

FIG. 6 is a top view of the fluid distribution ring with variable diameter holes, as is shown within the chamber of FIG. 5.

Figure 7:
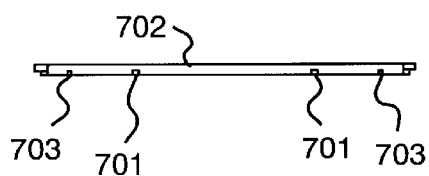

FIG. 7 is a front view of the fluid distribution ring of FIG. 6.

Figure 8:
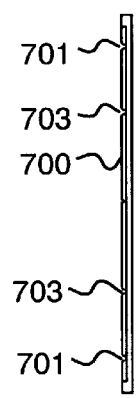

FIG. 8 is a left side elevation of the fluid distribution ring of FIG. 6.

Figure 9:
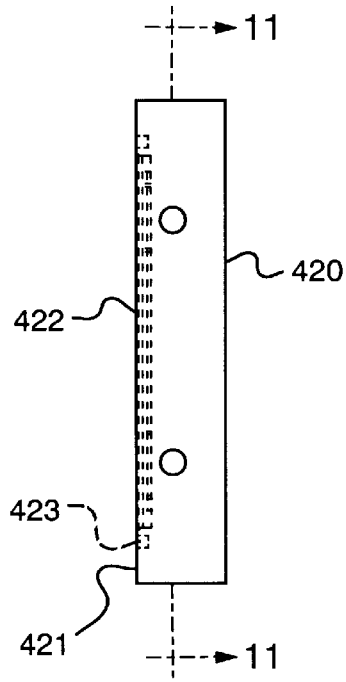

FIG. 9 is a side elevation of the chamber of FIG. 5.

Figure 10:
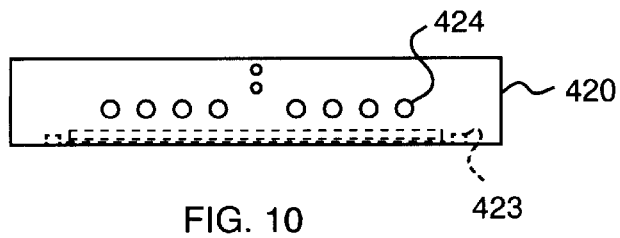

FIG. 10 is a rear elevation of the chamber of FIG. 5.

Figure 11:
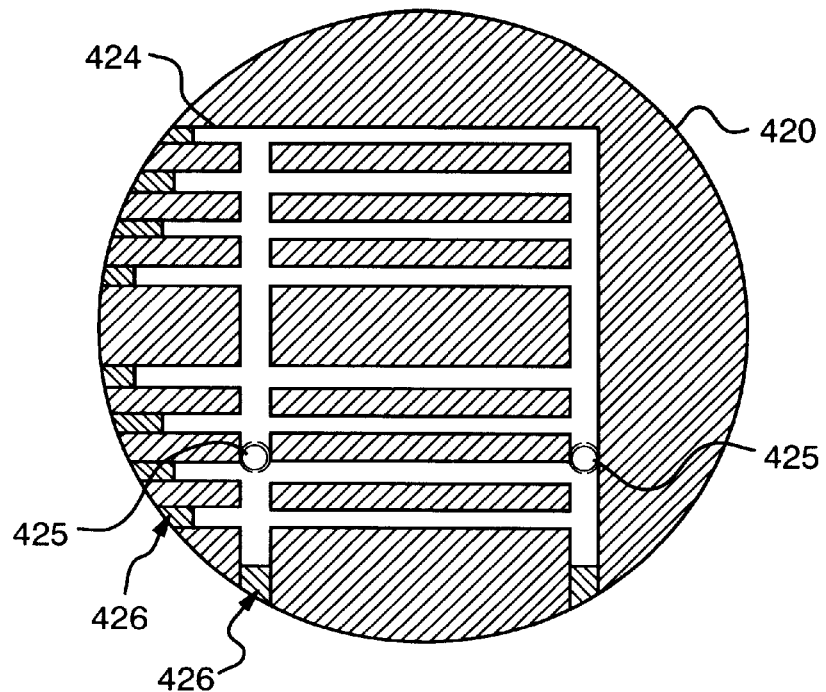

FIG. 11 is the AA cross section view of the chamber of FIG. 10, revealing it's interior water channels.

Figure 12:
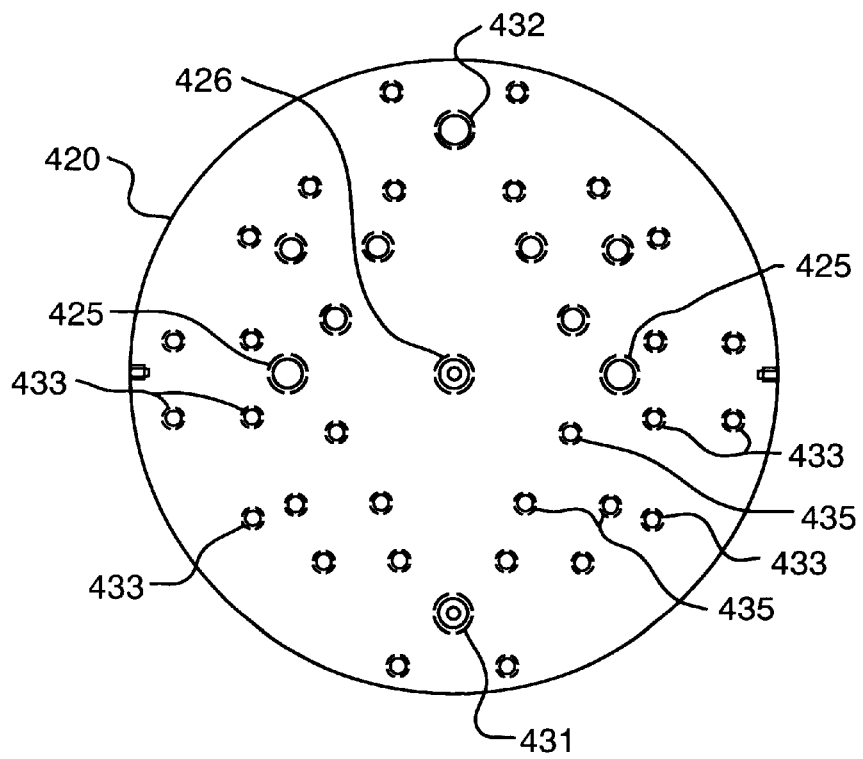

FIG. 12 is a bottom view of the chamber of FIGS. 5, 9 and 10, showing the ports to it's water channels and to the interior cavity of the pressure vessel, and the mounting holes for the lower roller plates.

Cover

FIG. 13 is a top view of the cover of the pressure vessel of FIG. 1, showing the ports to it's water channels and the mounting holes for the upper roller wedges.

FIG. 14 is a left side elevation of the cover of FIG. 13.

FIG. 15 a front elevation of the cover of FIG. 13.

Figure 16:
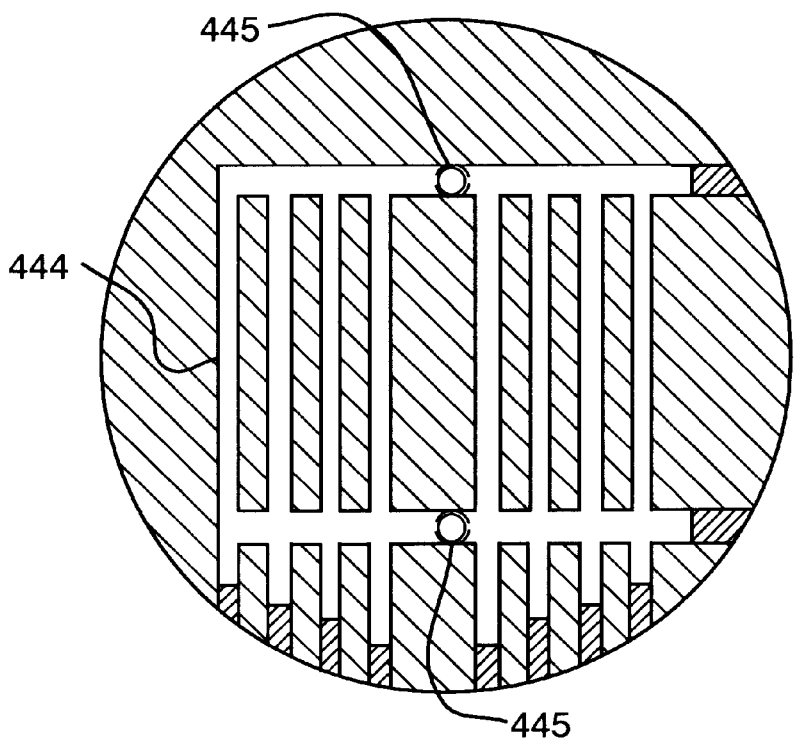

FIG. 16 is the AA section view of the cover of FIG. 14, revealing it's interior water channels.

Figure 17:
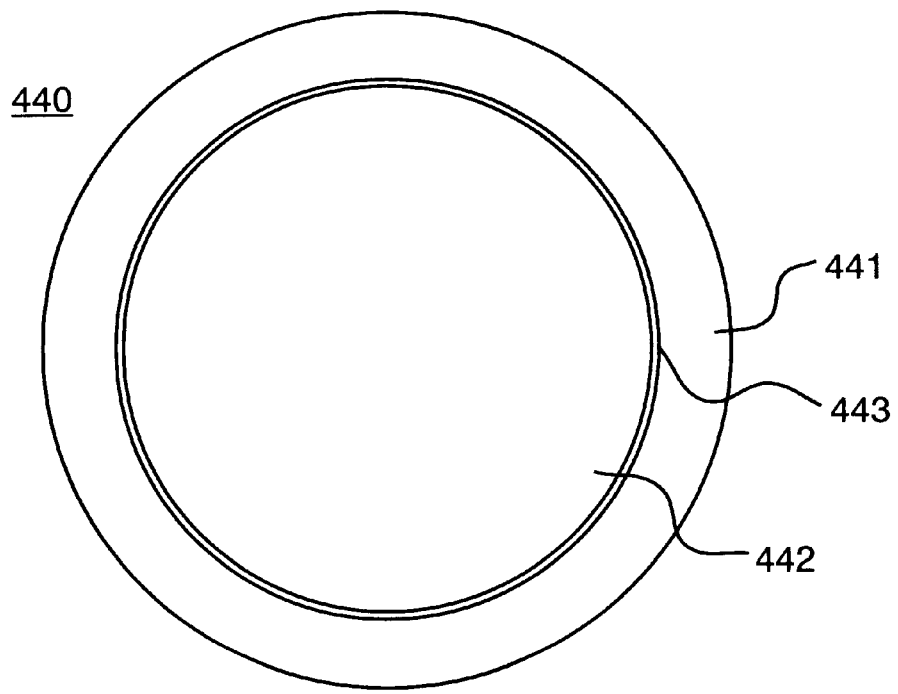

FIG. 17 is a bottom view of the cover of FIG. 13, showing the upper surface of the closed cavity of the pressure vessel of FIG. 1.

Clamp Half Locking Ring

Figure 18:
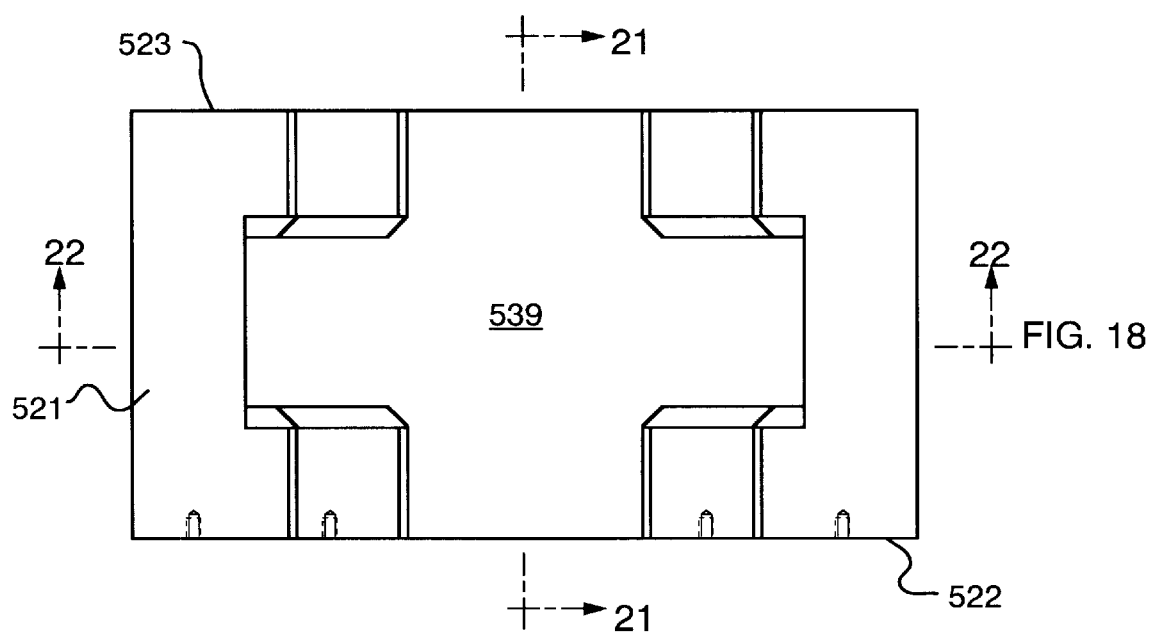

FIG. 18 is a front elevation of the left side clamp half locking ring of the clamping assembly of FIGS. 1 and 4.

Figure 19:
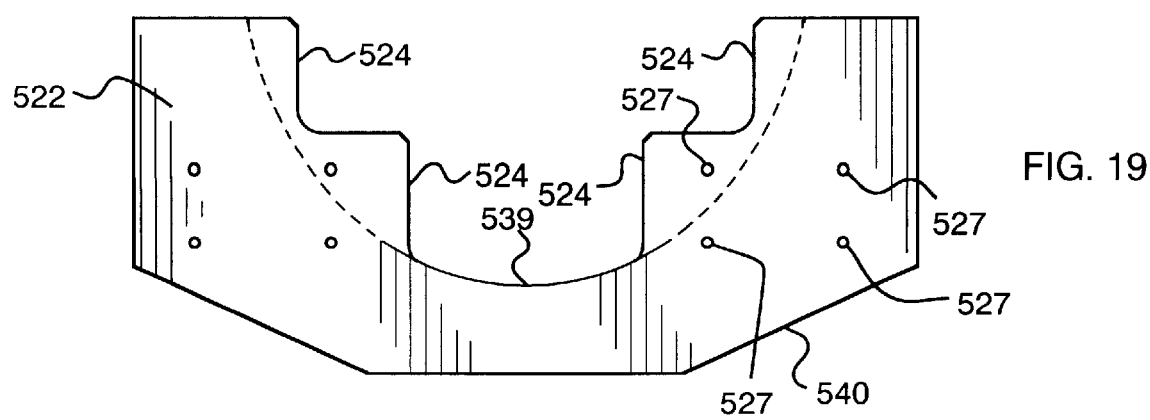

FIG. 19 is a bottom view of the left side clamp half locking ring of FIG. 18, showing the mounting holes for the rail guides.

Figure 20:
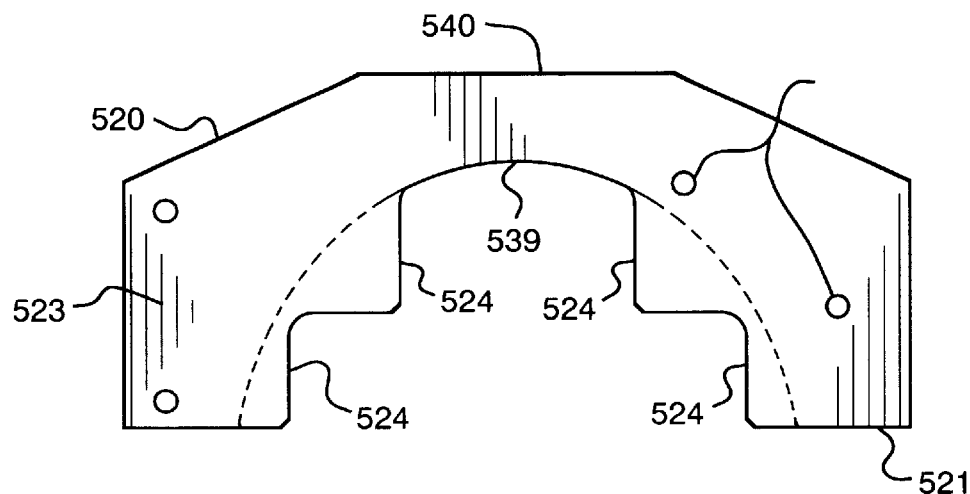

FIG. 20 is a top view of the left side clamp half locking ring of FIG. 18, showing the mounting holes for the top plate.

Figures 21, 23:
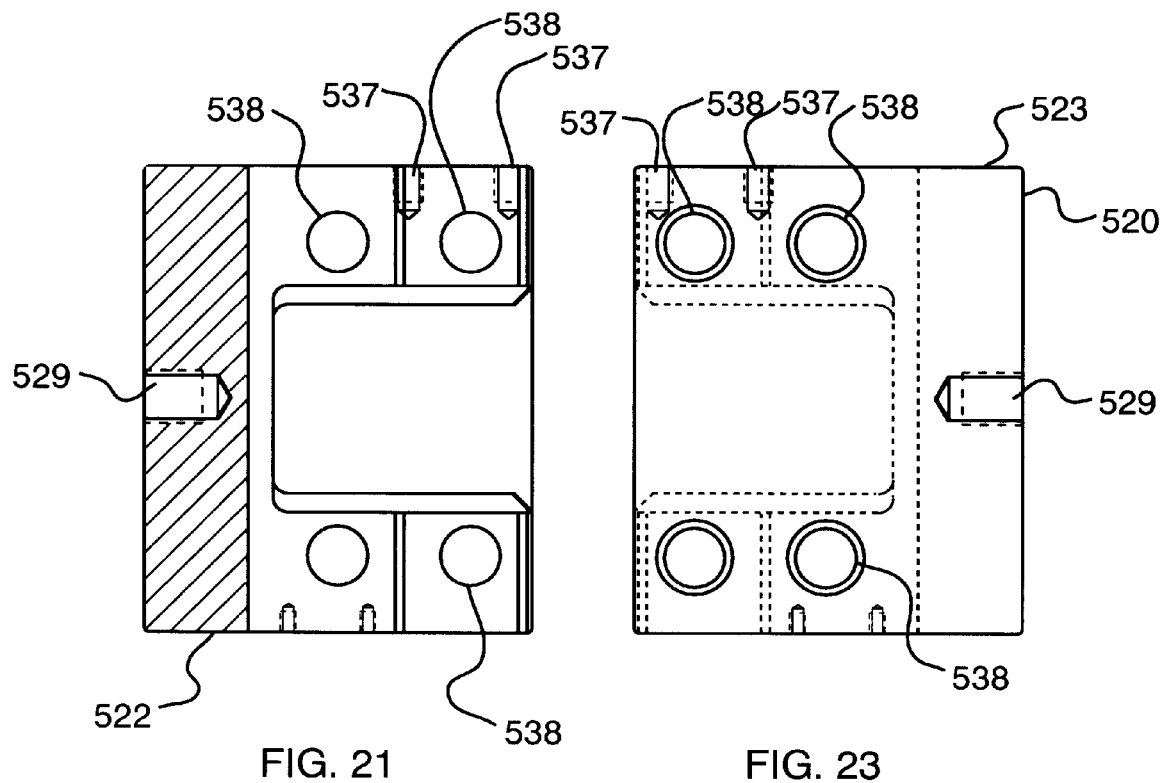

FIG. 21 is an AA sectional view of the locking ring of FIG. 18.

Figure 22:
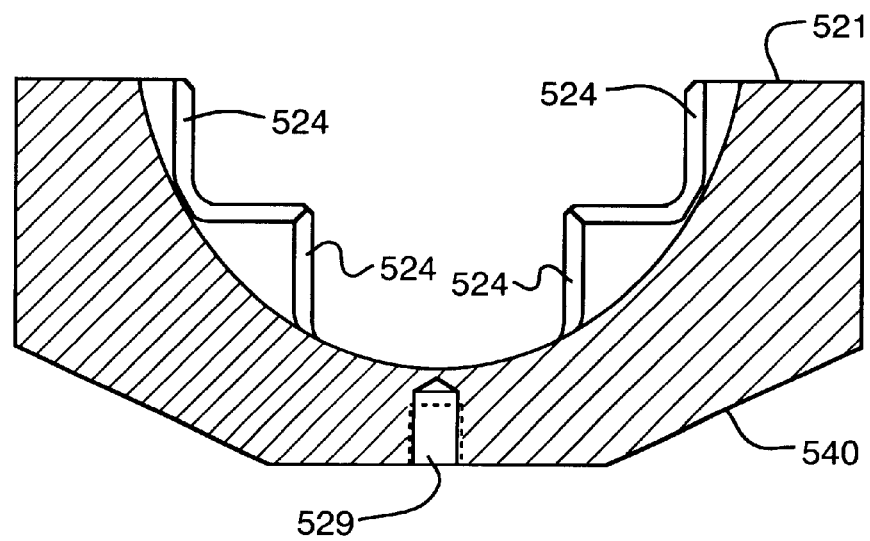

FIG. 22 is a BB sectional view of the locking ring of FIG. 18.

FIG. 23 is a right side elevation of the locking ring of FIG. 18.

Clamping Mechanism

Figure 24:
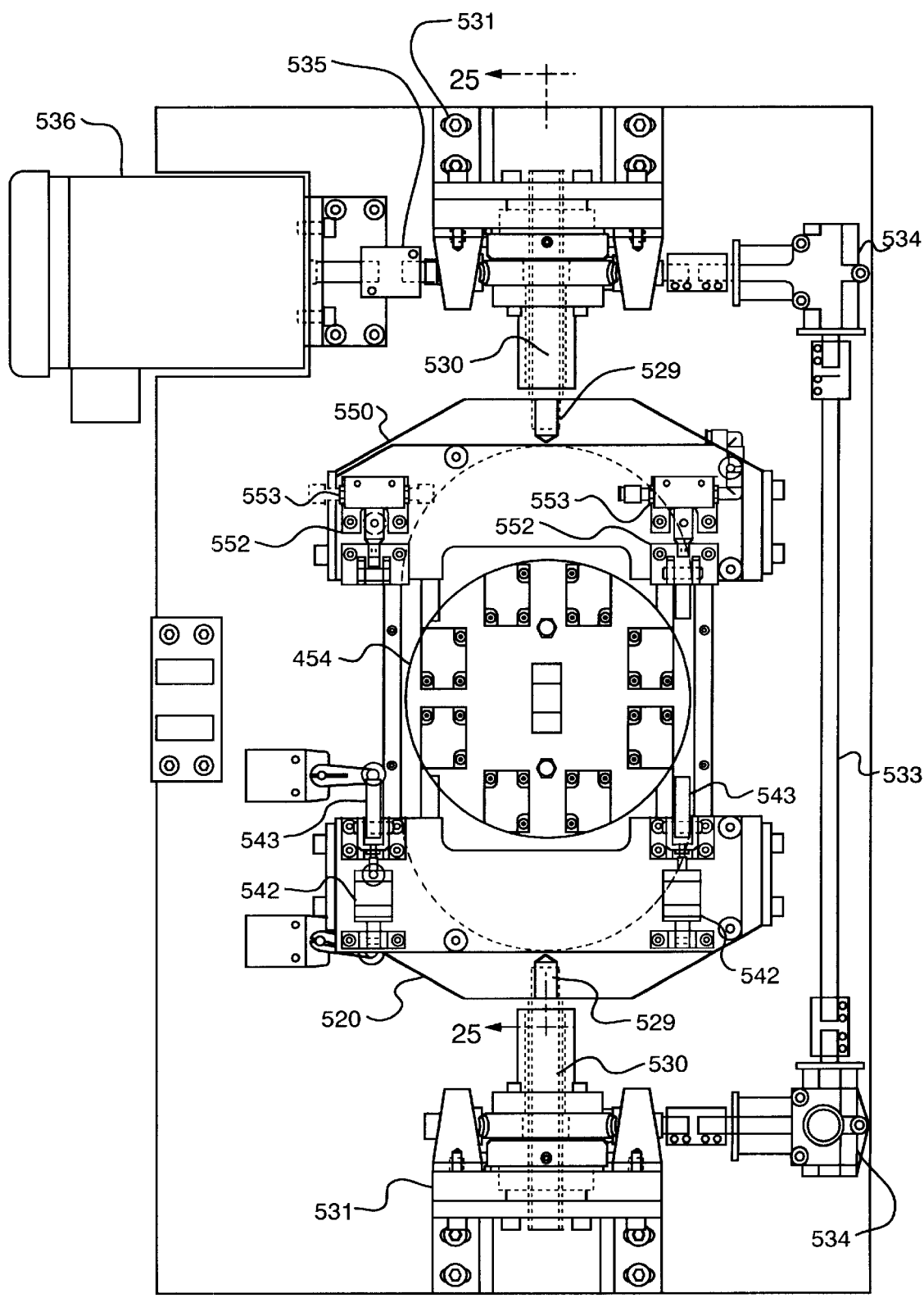

FIG. 24 is a top view of the clamping mechanism of FIG. 4.

Figure 25:
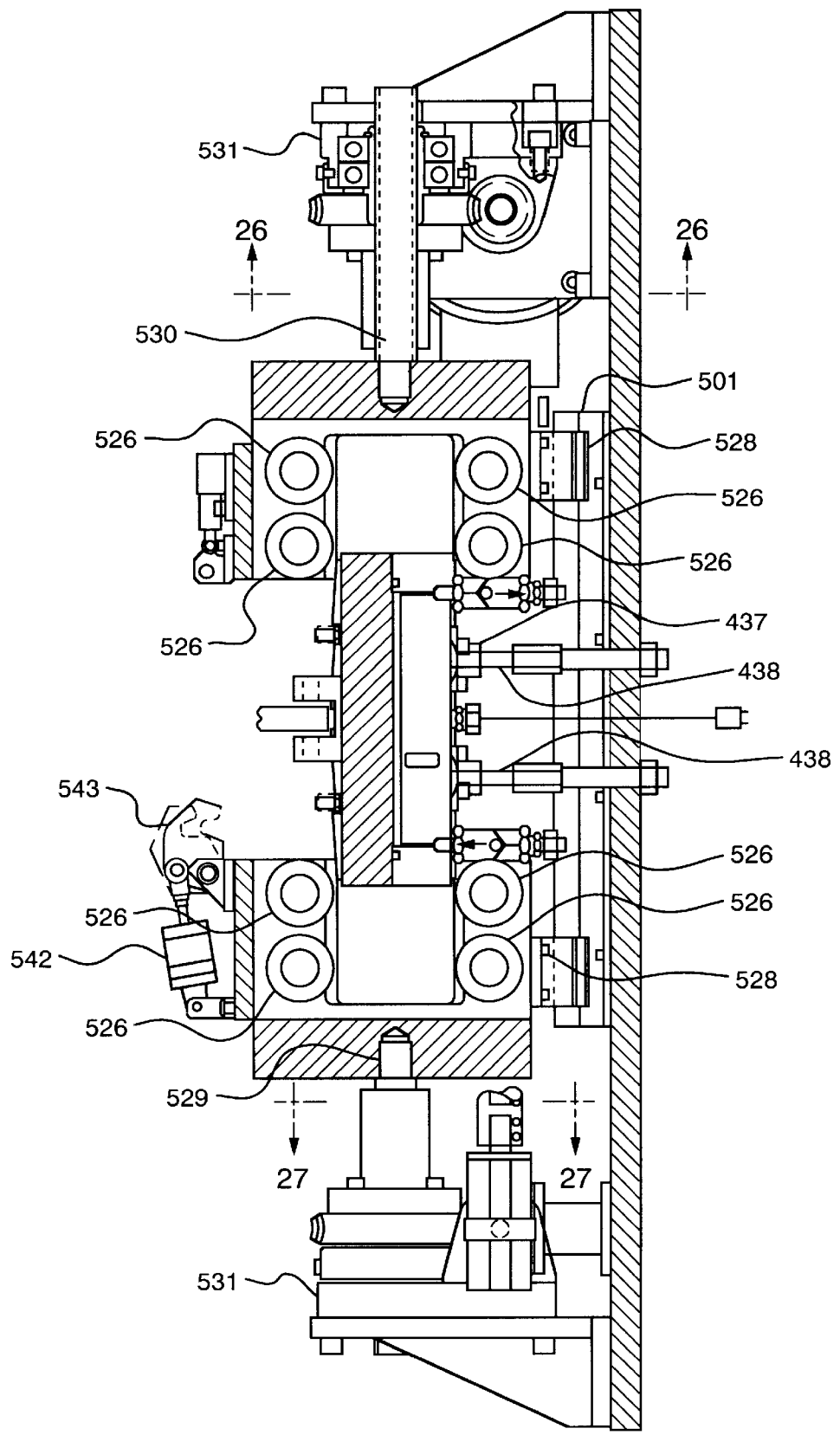

FIG. 25 is the AA sectional view of FIG. 24, showing details of the clamping mechanism.

Figure 26:
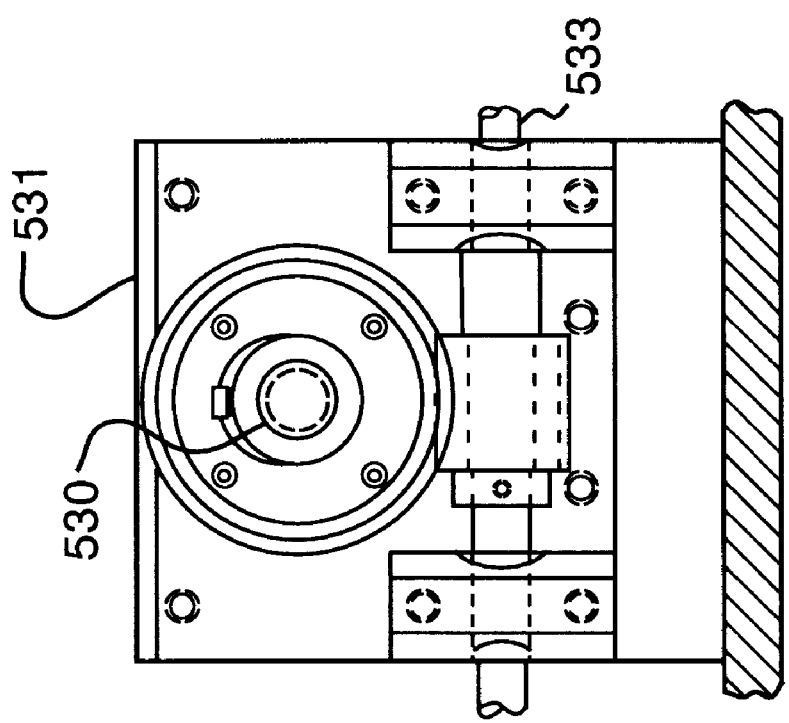

FIG. 26 is the BB sectional view of FIG. 25, showing the right side spindle drive gearbox.

Figure 27:
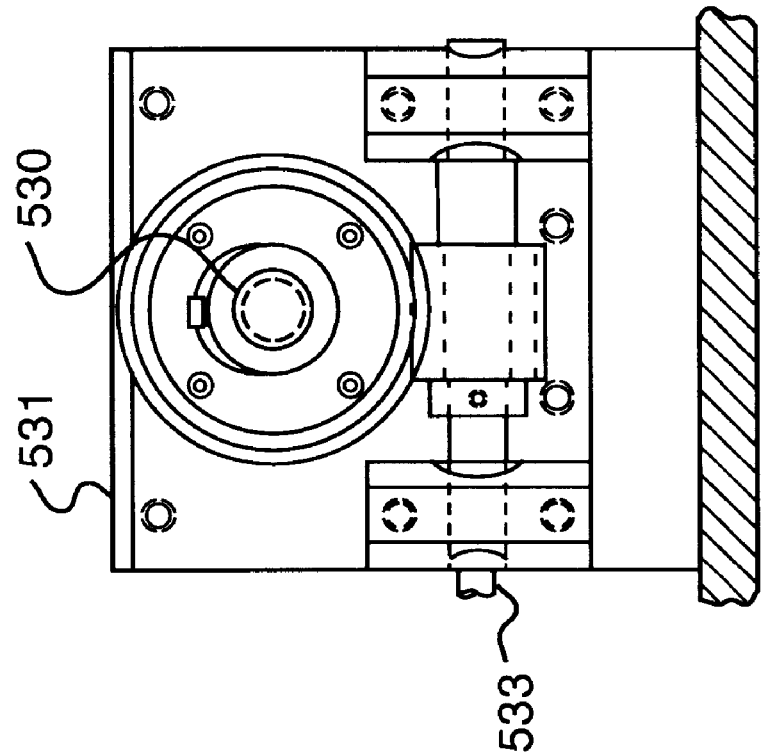

FIG. 27 is the CC sectional view of FIG. 25, showing the left side spindle drive gearbox.

Valve Assembly

Figure 28:
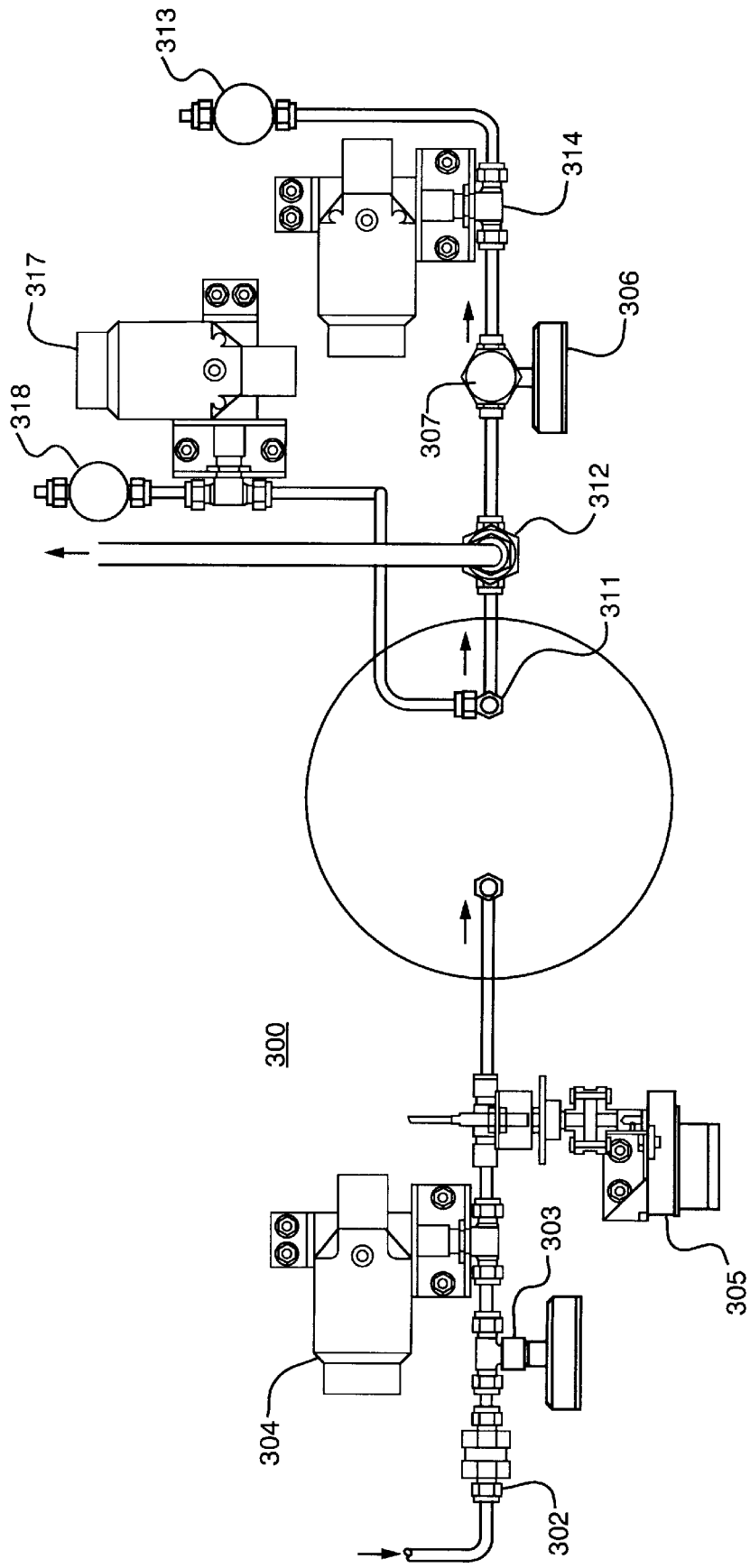

FIG. 28 is a top view of the valve assembly of FIG. 1, showing the mechanical layout of the $CO_2$ plumbing.

Figure 29:
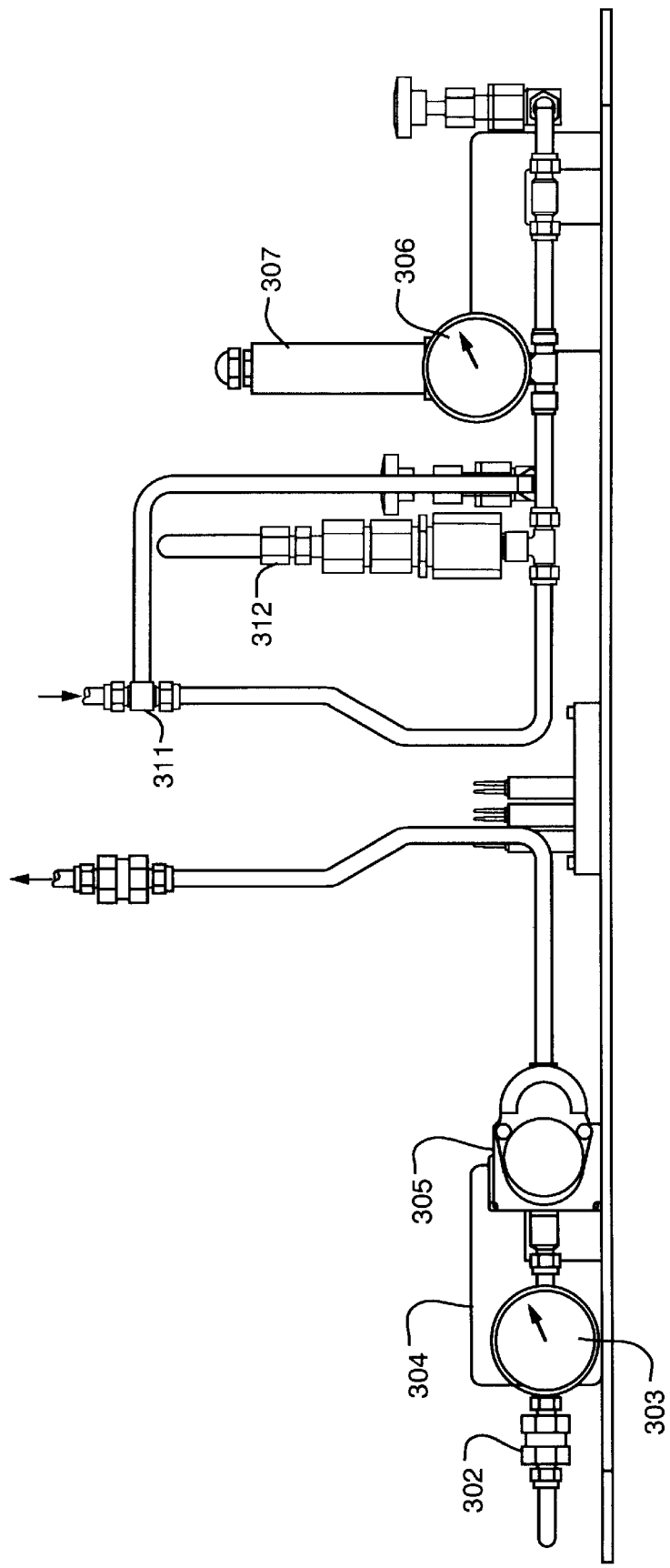

FIG. 29 is front elevation of the valve assembly of FIG. 28.

Figure 30:
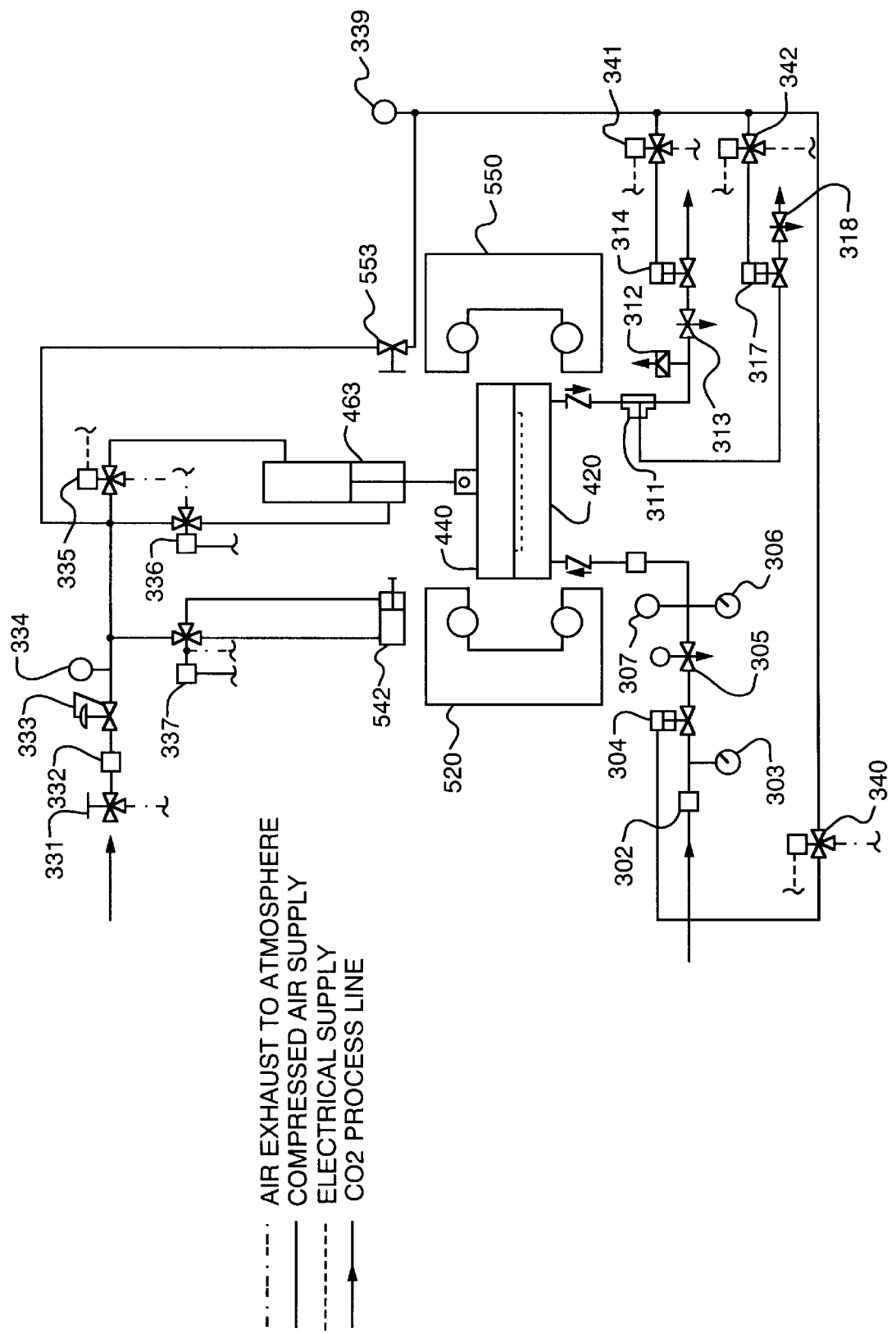

FIG. 30 is a schematic diagram of CO2 and compressed air systems of the supercritical fluid dryer.

Figure 31:
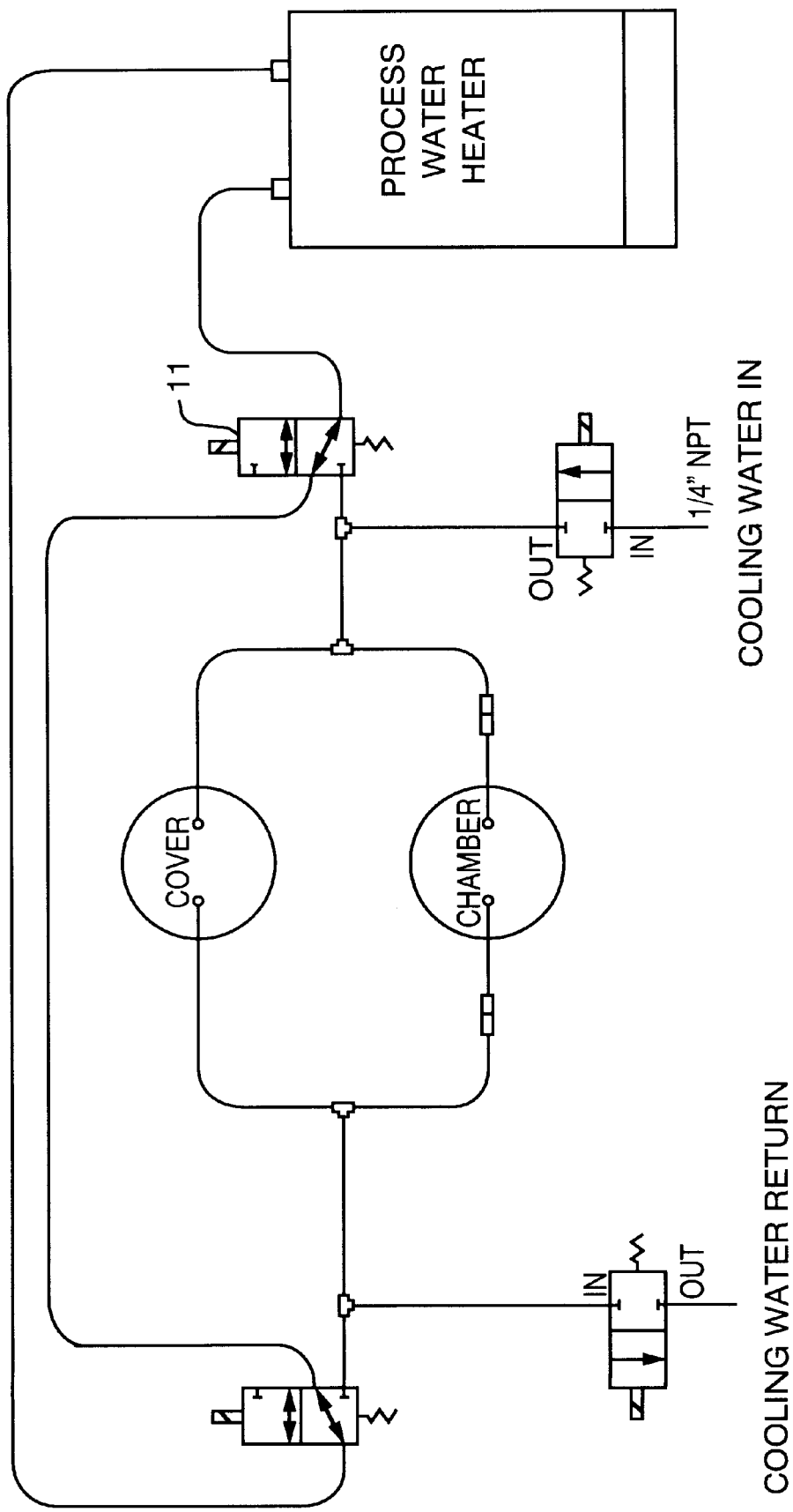

FIG. 31 is a schematic of the water circulation system of the preferred embodiment.

DESCRIPTION OF THE PREFERRED EMBODIMENT

The invention is susceptible of many variations. Accordingly, the drawings and following description of the preferred embodiment are to be regarded as illustrative in nature, and not as restrictive.

Overview of Structure

Referring to FIGS. 1–4, the relationship of the principal components of the supercritical fluid dryer is clearly disclosed. The principal components consist of a water heater/cooler 100 positioned closely to table frame 200, which supports valve assembly 300, pressure vessel 400, clamping mechanism 500 and control panel 600. The dryer requires the following inputs: a standard single phase, 115 volt, 40 ampere electrical supply, 0.5 SCFM (standard cubic feet per minute of compressed air at 60–80 PSIG, and 0.01 cu. ft. (liquid volume) of $CO_2$ at 1200 PSIG.

Table frame is configured with retractable castors 202, and hood 204. Hood 204 has a transparent viewing panel 206 on the front side, and a blowout panel 208 on the back side.

Mounted to the back side of table frame 200 is compressed air manual shutoff valve 331, inline filter 332, pressure regulator 333, and pressure gauge 334. Also shown are $CO_2$ supply inlet 301, $CO_2$ process outlet 315, $CO_2$ vent outlet 320, and safety valve outlet 321.

Chamber

Referring to FIGS. 5–12, chamber 420 of pressure vessel 400 of FIG. 1 is depicted from several views. FIGS. 5, 9 and 10 clearly disclose mating surface 421 within which is centered chamber cavity 422, a shallow recess sufficiently large to accept a silicon wafer with supports. O-ring grove 423 in mating surface 421 accepts an O-ring seal for sealing the chamber to cover 440 (FIGS. 13–17).

Referring to FIGS. 6–8, different views of the fluid distribution ring 700 are shown. The fluid distribution ring structure creates by its profile, outer circumfrential channels connected by small lateral channels 701 and 703 to the chamber cavity 422. Opposing areas 702, generally coinciding with fluid inlet and outlet ports (ref. FIG. 12., ports 431 and 432), are blocked off or void of such channels.

Referring to FIG. 11, the internal interconnected cooling channels 424 are bored into the chamber from two sides, the entrance holes being then plugged. Two cooling channel ports 425 through the bottom of chamber 420 into the channels provide inlet and outlet for heating/cooling water provided from water heater/cooler 100.

Referring to FIG. 12, thermocouple bore 426 accepts a type T thermocouple 436 to provide temperature data on chamber 420. Carbon Dioxide ($CO_2$) inlet port 431 and $CO_2$ outlet port 432 access cavity 422 through the bottom of chamber 420. The four sets of three hole patterns of support flange screw holes 435 are provided for mounting support flanges. Eight sets of three hole patterns of bottom roller plate screw holes 433 are provided for attach points for eight bottom roller plates 434 (not shown in this view).

Cover

Referring now to FIGS. 13–17, the cover 440 of pressure vessel 400 is the same overall diameter as chamber 420 of FIGS. 5–12. Mating flange 441 transitions by tapered shoulder 443 to interior surface 442. This surface forms the top of cavity 422 of chamber 420 when the cover is placed on the chamber. Cover 440 has lift assembly attach point 450 centered on it's top side, and is configured with internal cooling channels 444 and cooling channel ports 445, similar to the corresponding features of chamber 420. Eight sets of three hole patterns of locking wedge screw holes 453 are provided as mounting points for locking wedges 454 (not shown in this view).

Clamp Half Locking Ring

Referring to FIGS. 18–25 generally, and 18–23 specifically, the left clamp half locking ring 520 of clamping mechanism 500 is depicted from several perspectives. Referring to FIGS. 18, 19 and 20, face surface 521 intersects at opposing edges with bottom surface 522 and top surface 523. FIGS. 21 and 22 show the stepped arrangement of the four upper and four lower cam follower roller mounting surfaces 524A and 524B respectively. Cam follower roller mounting surfaces 524A and 524B have cam follower roller mounting holes 538 through which cam follower roller attach bolts 525 are used to attach cam follower rollers 526.

Upper and lower cam follower roller mounting surfaces 524A and 524B are separated by semi circular interior surface 539, which accommodates and conforms generally to the circular shape and height of one side of closed pressure vessel 400.

Top surface 523 has several safety plate screw holes 537. Bottom surface 522 has four hole pattern linear bearing screw holes 527 for linear bearings 528 (not shown in this view). Back surface 540 has ball screw attach point 529 from which left clamp half locking ring 520 is pushed and pulled between the open and clamping positions of clamping mechanism 500.

Clamping Mechanism

Referring to FIGS. 24–27, the layout of clamping mechanism 500, with it's attendant components is illustrated in detail. FIGS. 22 and 23 show left and right clamp half locking rings 520 and 550 in the open position, with cover 440 of pressure vessel 400 in place on chamber 420.

Referring to FIG. 25, two parallel rails 501 are configured to extend left and right across the bed of table frame 200. Linear bearings 528 are mounted to the underside of clamp half locking rings 520 and 550, and slidingly engaged with rails 501.

Referring to FIG. 24, reversible and variable speed drive motor 454 is connected by shaft coupler 535 to drive train 532 which consists of several drive shaft elements 533 and two right angle drives 534, to transfer power to left and right side transmissions 531. Left and right side transmissions 531 are interlocked by the drive train and configured to advance and retract screws 530 attached to ball screw attach points 529 on the back surfaces 540 of respective left and right clamp half locking rings 520 and 550, thereby advancing and retracting the clamp half locking rings on rails 501 in a synchronous manner towards and away from each other between open and clamping positions.

Referring to FIG. 25, chamber 420 is configured with support flanges 437 on its lower surface and supported by support rods 438 secured to table frame 200. Cover 440 shown here in its closed position on top of chamber 420, is retractable via cover lift assembly 460 (not shown in this figure) to provide access to the cavity of chamber 420.

With cover 440 in the closed position, drive motor 536 is operable to cause advancement of clamp half locking rings to a clamping position around pressure vessel 400, causing left side and right side upper cam follower rollers 545A and 555A to contact respective locking wedges 454 on cover 440, and left side and right side lower cam follower rollers 545B and 555B to contact respective bottom roller plates 434 mounted to the bottom of chamber 420. The advancement of upper cam follower rollers over the 2 degree positive incline of locking wedges 454, opposed by the support of chamber 420 by lower cam follower rollers against the bottom roller plates, causes compression and clamping of mating flange 441 of cover 440 against an O ring in grove 423 and the mating surface 421 of chamber 420, thus sealing chamber cavity 422.

Left and right side safety plates 541 and 551 are bolted to top surfaces 523 of respective left and right clamp half locking rings 520 and 550. The safety plates are cut out on their respective leading edges so that when advanced to a clamping position, there is clearance for cover lift assembly 460. Pneumatically actuated safety latch assemblies 542 are mounted to either end of left side safety plate 541. Corresponding latch pin assemblies 552 are mounted to either end of right side safety plate 552 on right clamping half locking ring 550. Latch assemblies 542 are further configured with latch cams 543 which are engagable with the latch pin assemblies 552 when the clamp half locking rings are advanced to a clamping position. Latch pin assemblies 552 are further configured with plunger actuated pneumatic valves 553, such that the proper engagement of latch cams 543 with respective pin assemblies 552 operates their plunger actuated pneumatic valves 553.

Cover Lift Assembly

Figure 2:
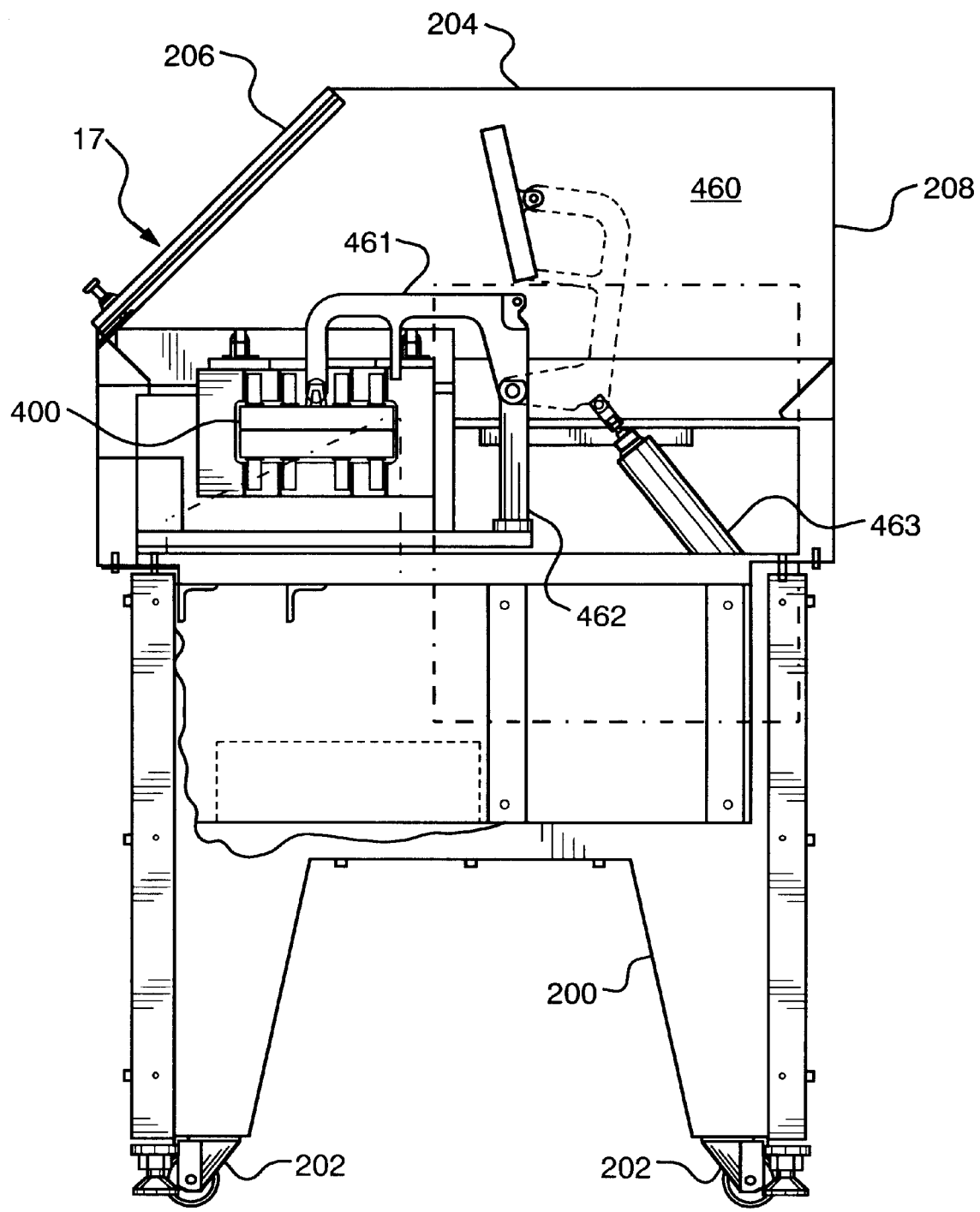
FIG. 2 is a right side elevation of the supercritical fluid dryer of FIG. 1, with the pressure vessel cover shown in phantom in the open position.

Referring to FIGS. 2 and 4, cover lift assembly 460 consists of cover lift arm 461, pivotally connected at one end to cover 440, and at it's other end to stanchion 462, which in turn is secured to table frame 200. Lift arm pneumatic cylinder is pivotally attached at one end to table frame 200 and at it's other end to a midpoint on cover lift arm 461, such that full extension of pneumatic cylinder 463 positions cover 440 on chamber 420, and full compression lifts cover 440 to the dotted line position of FIG. 2.

Valve Assembly $CO_2$ System

Referring to FIGS. 28, 29 and 30, valve assembly 300 with it's associated parts is illustrated. $CO_2$ supply inlet 301 (shown on FIG. 3) is connected serially by high pressure tubing to $CO_2$ inline filter 302, pneumatically actuated normally closed $CO_2$ supply shutoff valve 304, stepper motor operated $CO_2$ metering valve 305, metered $CO_2$ pressure gauge 306, metered $CO_2$ pressure transducer 307, and hence through $CO_2$ inlet 431 into cavity 422 of chamber 420 (shown on FIGS. 11 and 12). A back flow check valve is incorporated at inlet 431.

Figure 3:
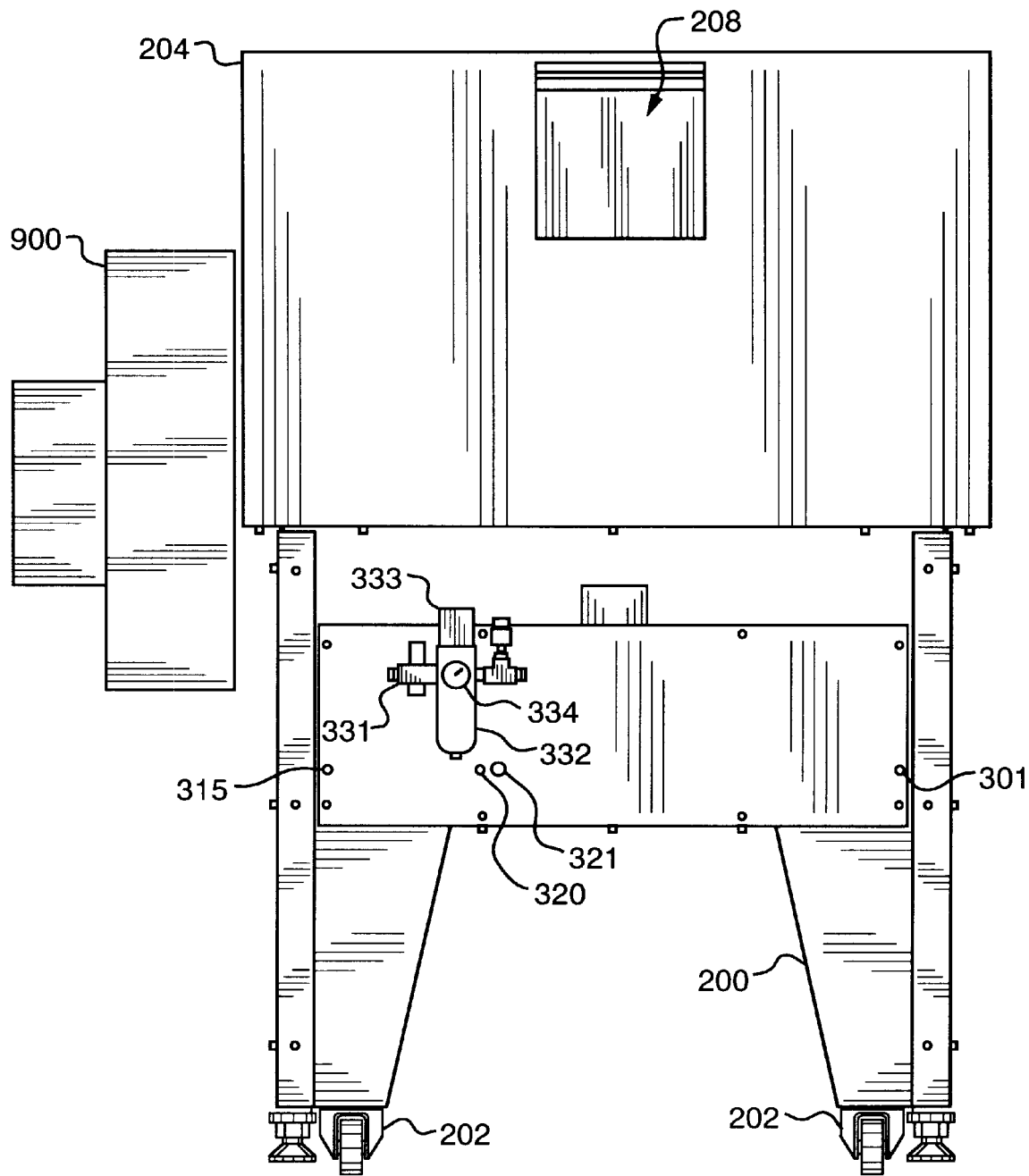
FIG. 3 is a rear elevation of the supercritical fluid dryer of FIG. 1, showing compressed air and $CO_2$ inlets.

Cavity 422 (of FIGS. 11 and 12) is further connected via $CO_2$ outlet 432 serially by high pressure tubing to $CO_2$ chamber outlet Tee 311, over pressure safety valve 312, manually operated $CO_2$ outlet valve 313, pneumatically actuated normally open $CO_2$ outlet shutoff valve 314, and hence to $CO_2$ process outlet 315 (shown on FIG. 3). An adjustable heat jacket 316 covers outlet valve 313 and shutoff valve 314. Also, $CO_2$ chamber outlet Tee 311 is further serially connected by high pressure tubing to pneumatically actuated normally open $CO_2$ vent line shutoff valve 317, manually operated $CO_2$ vent line metering valve 318, and hence to vent outlet 320 (shown on FIG. 3). Safety valve 312 is further connected to safety valve outlet 321 (shown on FIG. 3).

Compressed Air System

Referring to FIGS. 28, 29 and 30, the compressed air system of the dryer consists of components connected by pressure tubing as follows: inlet 330 (FIG. 3) to manual shutoff valve 331, to inline filter 332, to pressure regulator 333, the pressure regulator thus providing regulated air to pressure switch 334, to lift arm closing solenoid valve 335 and hence to pneumatic cylinder 463. Regulated air is likewise provided to lift arm opening solenoid valve 336 and hence to the other end of pneumatic cylinder 463. Regulated air is likewise provided to safety latch solenoid valve 337, and hence to both ends of the pneumatic cylinders of safety latch assemblies 542.

Regulated air is further supplied through serially connected plunger actuated pneumatic valves 553 of latch pin assemblies 552, to process section pressure switch 339, to $CO_2$ supply shutoff solenoid valve 340 and hence to shutoff valve 304, to $CO_2$ outlet shutoff solenoid valve 341 and hence to shutoff valve 314, and to $CO_2$ vent line shutoff solenoid valve 342 and hence to shutoff valve 317.

Water Circulation System

Referring to FIG. 31, the water circulation system of water heater/cooler 100 is illustrated. Water heater/cooler 100 is able to heat or cool water as necessary to maintain a selected temperature range, and continuously pump water out outlet 101, to a 3-way solenoid preheat bypass valve 102, and switchable there from to either pressure side tee 103, hence in parallel to respective cooling channels of cover 440 and chamber 420, collecting return water to return side tee 104, passing through a second 3-way solenoid preheat bypass valve 105, and back to inlet 106. Bypass valves 102 and 105 are connected with a shunt line and operated together such that water is switchable to be passed through the cover and chamber, or bypassed through the shunt line. Type T thermocouple 436 mounted in the center of the underside of chamber 420, provides temperature feedback for the control function.

Control Panel

Referring now to FIG. 1, control panel 900 integrates control of the various electrically controllable components with a keyboard/display and computer capability that provides manual control from the keyboard as well as programmable semi-automatic sequencing of the functions of the dryer. Common limit switches and pressure switches are electrically connected to the control panel are variously placed and adjusted to detect travel limits of moving components, or pressure levels, for control purposes in accordance with the overall process.

Operating Cycle

Prior to insertion of a wafer, the pressure vessel is filled with approximately 30 milliliters of methanol. A wafer is then placed onto a support structure while keeping a film of methanol on the wafer surface. The support structure allows an open space above and below the wafer for unobstructed flow.

The process is then started by pressing the start button on the control panel. The control panel display will prompt the operator for any necessary intervention and provide a readout of process status during the cycle. The cycle commences with the chamber cover being lowered by a pneumatic cylinder and locking clamps being driven into position by an electric motor and gear train. This forces cam follower rollers on the clamps to contact tapered locking wedges on the cover, compressing the cover to the vessel o-ring seal and creating a sealed and locked assembly. An electrical limit switch controls the clamp position.

At this point in the cycle, two safety latches located on top of one of the clamps are pneumatically actuated to provide additional resistance to an undesired opening due to process pressure. These latches when brought into position latch onto mounted pins located on the other clamp and contact two plunger actuated pneumatic valves which in turn allow air pressure to a bank of solenoid valves. The solenoid valves in turn operate the $CO_2$ inlet, dilution and vent shutoff valves making for a fail safe system because the vessel cannot be pressurized unless the clamps are closed and the safety latches are locked.

When the above conditions are met the $CO_2$ inlet valve opens and begins pressurizing the vessel. The distribution ring in the chamber cavity inhibits turbulence and promotes a laminar flow of $CO_2$ around the subject wafer. The flow rate is controlled by the motor positioning metering valve. It is important to pressurize the vessel slowly to avoid turbulence on the product. A transducer mounted in the inlet line senses pressure and provides a signal to the control panel for set point comparisons.

When 1100 psi is reached the dilution shutoff valve opens and the $CO_2$/methanol mixture begins to dilute out. A manually controlled metering valve regulates the outlet flow to avoid turbulence in the vessel while the inlet metering valve is opened further to assure enough pressure to keep the $CO_2$ in a liquid state (900 psi minimum). The dilution mode is controlled by a timed set point (approximately 8 minutes for this embodiment). At this point the PLC checks for a minimum pressure of 1100 psi and if found to be lower closes only the outlet shutoff valve while leaving the inlet open. When the set point is satisfied both valves will be closed and the heating mode will start.

Both the vessel and the cover have channels machined into them for flowing water for temperature control. A packaged heater/chiller provides the means for pumping water through the channels and heating the $CO_2$ to 35–40 deg. Celsius. There is a thermocouple mounted in the vessel providing a signal to the control panel for set point comparisons. Preheated water is pumped through the system for approximately 10 minutes to achieve the temperature noted above. The pressure will undergo a corresponding rise of approximately 200 psi as the temperature increases and when the set point temperature is made a supercritical state has been reached.

The supercritical drying is essentially complete at this point and the $CO_2$ needs to be vented for the start of another cycle. A vent circuit consisting of a shutoff and metering valve similar to the dilution circuit is also located on the outlet of the vessel. When the heating mode is complete the shutoff valve opens and performs a controlled vent of the system. This takes approximately five minutes during which time the chiller brings the water temperature back under 30 degrees Celsius.

When atmospheric pressure is reached the safety latches are released and the operator is prompted to press the start button to drive the clamps open. The clamps open until they contact an electrical limit switch which stops the drive motor and initiates the opening of the cover. The wafer is removed and the system is ready for the next cycle.

As will be realized, the invention is capable of other and different embodiments, and its several details are capable of modifications in various obvious respects, all without departing from the essence of the invention.

As an example, the invention includes an apparatus for drying a microelectronic structure on wafer substrate, which has a pressure vessel with a lid and a base with an open cavity or bowl or depression formed in its top surface that is of uniform diameter and constant depth sufficient to contain at least one microelectronic structure on wafer substrate. A deeper cavity will hold several wafers in a stacked arrangement. The lid being emplaced on the base closes the cavity.

The invention includes a mechanism for placing the lid on the base, such as a pneumatically actuated cylinder that raises and lowers the lid, and has a way for clamping the lid to the base by using at least two locking clamp rings, each having an open jaw sufficiently large to partially enclose the edge of the vessel.

The base of the vessel may be supported on stanchions on a base assembly and the lid operated by a swinging arm mechanism also attached to the base. The rings are supported symmetrically about the circumference of the vessel and oriented with the jaws facing the vessel. The rings are individually adjusted, or collectively movable by a common drive mechanism, between an open position where the rings are clear of the vessel and a locking position where the jaws partially enclose the vessel. The jaws and the vessel share a tapered cam plate and roller system configured to bring the rings into vertically compressive locking engagement on the pressure vessel when the rings are moved into locking position.

The invention includes the necessary mechanisms and systems for controlling pressure in the cavity, for controlling temperature in the cavity, for flowing process fluid through the cavity, for venting the cavity, for unclamping the pressure vessel, and for removing the lid from the base.

As another example, for clamping the lid to the base, the invention may use two locking clamp rings, with the jaws configured with internal upper and lower rollers, and the vessel configured with top and bottom tapered cam plates, where the rollers are configured to contact respective cam plates when the rings are moved into locking position, bringing the rings into vertically compressive locking engagement on the pressure vessel.

As yet another example, the invention includes an apparatus that has a control panel and control circuits for automatic operation according to a pre-determined sequence of process steps and within manually selectable or pre-determined limits of temperature, pressure and time. The apparatus may have a computer and control panel interconnected with other systems on the device, where the computer is programmable or programmed with a predetermined process sequence, and may include pre-determined or programmable limits of temperature, pressure and time.

As still yet another example, the apparatus may have a way for rigidly interconnecting or interlocking the locking clamp rings when in the locking position, such as a latching system with mating components secured to respective locking clamp rings and aligned so as to be brought into connecting position when the rings are moved into locking position.

As even still yet another example, the invention includes a pressure vessel with a way of distributing the incoming flow of process fluid around the circumference of its cavity, such as a system of channels connecting an incoming port to a plurality of orifices arranged symmetrically about the circumference of the cavity.

As another example, the invention includes an apparatus for use with a wafer substrate being fabricated of silicon material, where the process fluid is carbon dioxide, the temperature in the cavity can be raised and regulated at in excess of 30 degrees centigrade, and the pressure in the cavity can be raised and regulated at in excess of 1000 pounds per square inch over atmosphere.

As still another example, the invention includes a method for drying a microelectronic structure on wafer substrate, including the steps of submerging a microelectronic structure on wafer substrate in methanol in a horizontally oriented cavity of uniform diameter and constant vertical depth in the base of a pressure vessel consisting of a base and a lid, placing the lid on the base, and clamping the lid to the base with two locking clamp rings. Each ring has an open jaw sufficiently large to partially enclose an edge of the vessel.

The method may include the base of the vessel being supported on stanchions on a base assembly and the lid operated by a swinging arm mechanism also attached to the base. The rings may be slidingly mounted on a common rail system that may run underneath the base, with the rings positioned on opposite sides of the vessel and oriented with their jaws open towards the vessel.

The method would include introducing a through flow of process fluid in the cavity at supercritical temperature and pressure, evacuating process fluid from the closed cavity, unclamping the lid from the base, removing the lid from the base, and removing the microelectronic structure on wafer substrate from the cavity.

As yet still another example, the method may be for a wafer substrate fabricated of silicon material, with the process fluid being carbon dioxide, the supercritical temperature being in excess of 30 degrees centigrade, the supercritical pressure being in excess of 1000 pounds per square inch over atmosphere, and further include the automatic controlling and sequencing of the other steps of the process. The first and last steps of loading and unloading the wafer from the cavity may be done either manually or by automated means.

As still yet another example, the process fluid inlet 431 of the chamber of FIG. 12 may be located in the chamber cover of FIGS. 13–17, so as to introduce the process fluid from above the methanol bath without turbulence, rather than up through the bath. The process fluid then displaces the methanol, which is exhausted through the lower outlet port 432. The distribution ring 700 of FIGS. 5–8, or a similar structure may likewise be configured in or incorporated with the cover, to disburse the incoming fluid uniformally and with minimal turbulence.

The objects and advantages of the invention may be further realized and attained by means of the instrumentalities and combinations particularly pointed out in the appended claims. Accordingly, the drawing and description are to be regarded as illustrative in nature, and not as restrictive.

What is claimed is:

1. An apparatus for drying a microelectronic structure on wafer substrate, comprising
   a pressure vessel with a lid and a base with an open cavity, said cavity being of uniform diameter and constant depth sufficient to contain at least one said microelectronic structure on wafer substrate, said vessel when closed comprising said lid emplaced on said base,
   means for placing said lid on said base,
   means for clamping said lid to said base, said means comprising at least two locking clamp rings, each said ring having an open jaw sufficiently large to partially enclose an edge of said vessel when closed, said rings supported symmetrically about the circumference of said vessel and oriented with said jaws facing said vessel, said rings movable between an open position where said rings are clear of said vessel and a locking position where said jaws partially enclose said vessel, said jaws and said vessel further comprising a tapered cam plate and roller system configured to bring said rings into vertically compressive locking engagement on said pressure vessel when said rings are moved into said locking position,
   means for controlling pressure in said cavity,
   means for controlling temperature in said cavity,
   means for flowing process fluid through said cavity,
   means for venting said cavity,
   means for unclamping said pressure vessel, and
   means for removing said lid from said base.

2. The apparatus of claim 1, said means for clamping said lid to said base further comprising two locking clamp rings, said jaws configured with internal upper and lower rollers, said vessel configured with top and bottom tapered cam plates, said rollers configured to contact respective said cam plates and bring said rings into vertically compressive locking engagement on said pressure vessel when said rings are moved into said locking position.

3. The apparatus of claim 2, further comprising means for rigidly interconnecting said locking clamp rings when in said locking position.

4. The apparatus of claim 3, said means for rigidly interconnecting comprising a latching system with mating components secured to respective locking clamp rings and aligned so as to be brought into connecting position when said rings are moved into said locking position.

5. The apparatus of claim 4, said means for flowing comprising means for distributing the incoming flow of said process fluid around the circumference of said cavity.

6. The apparatus of claim 5, said means for distributing the incoming flow comprising a system of channels connecting an incoming port to a plurality of orifices arranged symmetrically about the circumference of said cavity.

7. The apparatus of claim 6, said wafer substrate being fabricated of a silicon material, said process fluid being carbon dioxide, said means for controlling temperature being capable of raising and regulating temperature in said cavity in excess of 30 degrees centigrade, said means for controlling pressure being capable of raising and regulating pressure in said cavity in excess of 1000 pounds per square inch over atmosphere.

8. The apparatus of claim 1, further comprising means for automatic operation according to a pre-determined sequence of process steps and within manually selectable limits of temperature, pressure and time.

9. The apparatus of claim 8, said means for automatic operation comprising a computer and control panel interconnected with other said means, said computer programmed with said predetermined sequence, said computer being programmable with said manually selectable limits of temperature, pressure and time.

10. The apparatus of claim 1, further comprising means for automatic operation according to a pre-determined sequence of process steps and within pre-determined limits of temperature, pressure and time.

11. The apparatus of claim 1, said means for flowing comprising means for distributing the incoming flow of said process fluid around the circumference of said cavity.

12. The apparatus of claim 11, said means for distributing the incoming flow comprising a system of channels connecting an incoming port to a plurality of orifices arranged symmetrically about the circumference of said cavity.

13. An apparatus for drying a microelectronic structure on wafer substrate, comprising
   a pressure vessel with a lid and a base with an open cavity, said cavity being of uniform diameter and constant depth sufficient to contain a said microelectronic structure on wafer substrate, said vessel when closed comprising said lid emplaced on said base,
   means for placing said lid on said base,
   means for clamping said lid to said base, said means comprising two locking clamp rings linked by a drive mechanism, each said ring having an open jaw sufficiently large to partially enclose an edge of said vessel when closed, said rings slidingly mounted on opposing ends of a common rail passing beneath said vessel, said rings oriented with said jaws open towards said vessel, said rings collectively movable by a force on said drive mechanism between an open position where said rings are clear of said vessel and a locking position where said jaws partially enclose said vessel, said jaws configured with internal upper and lower rollers, said vessel configured with top and bottom tapered cam plates, said rollers configured to contact respective said cam plates and bring said rings into vertically compressive locking engagement on said pressure vessel when said rings are moved into said locking position,
   means for controlling pressure in said cavity,
   means for controlling temperature in said cavity,
   means for flowing process fluid through said cavity,
   means for venting said cavity,
   means for unclamping said pressure vessel, and means for removing said lid from said base.

14. The apparatus of claim 13, further comprising
a latching system with mating components secured to respective locking clamp rings and aligned so as to be brought into latching position when said rings are moved into said locking position, and
means for actuating said latching system.

15. The apparatus of claim 14, said means for flowing comprising means for distributing the incoming flow of said process fluid around the circumference of said cavity.

16. The apparatus of claim 15, said means for distributing the incoming flow comprising a system of channels connecting an incoming port to a plurality of orifices arranged symmetrically about the circumference of said cavity.

17. The apparatus of claim 13, said wafer substrate being fabricated of a silicon material, said process fluid being carbon dioxide, said means for controlling temperature being capable of raising and regulating temperature in excess of 30 degrees centigrade, said means for controlling pressure being capable of raising and regulating pressure in excess of 1000 pounds per square inch over atmosphere.

18. The apparatus of claim 17, further comprising means for automatic operation according to a predetermined sequence of process steps.

19. A method for drying a microelectronic structure on wafer substrate, comprising the steps of:
submerging a said microelectronic structure on wafer substrate in methanol in a horizontally oriented cavity of uniform diameter and constant vertical depth in the base of a pressure vessel comprising said base and a lid,
placing said lid on said base,
clamping said lid to said base with two locking clamp rings, each said ring having an open jaw sufficiently large to partially enclose an edge of said vessel, said rings located on opposite sides of said vessel and slidingly mounted on a common rail system, said rings oriented with said jaws facing said vessel, said rings interconnected by a drive mechanism and collectively movable between an open position where said rings are clear of said vessel and a locking position where said jaws partially enclose said vessel, said jaws configured with internal upper and lower rollers, said vessel configured with top and bottom tapered cam plates, said cam plates oriented with respect to said rollers to bring said rings into vertically compressive locking engagement on said vessel when said rings are moved into said locking position,
introducing a through flow of process fluid in said cavity at supercritical temperature and pressure,
evacuating said process fluid from said closed cavity,
unclamping said lid from said base,
removing said lid from said base, and
removing said microelectronic structure on wafer substrate from said cavity.

20. The method of claim 19 for drying a microelectronic structure on wafer substrate, said wafer substrate being fabricated of a silicon material, said process fluid being carbon dioxide, said supercritical temperature being in excess of 30 degrees centigrade, said supercritical pressure being in excess of 1000 pounds per square inch over atmosphere, further comprising the automatic controlling and sequencing of other said steps.

* * * * *